(12) United States Patent
Talwalkar

(10) Patent No.: US 9,712,115 B2
(45) Date of Patent: Jul. 18, 2017

(54) CURRENT-MODE POWER AMPLIFIER

(71) Applicant: QUALCOMM Incorporated, San Diego, CA (US)

(72) Inventor: Niranjan Talwalkar, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 6 days.

(21) Appl. No.: 14/950,295

(22) Filed: Nov. 24, 2015

(65) Prior Publication Data

US 2017/0149389 A1    May 25, 2017

(51) Int. Cl.
| | |
|---|---|
| *H03G 3/20* | (2006.01) |
| *H03F 1/02* | (2006.01) |
| *H03F 3/193* | (2006.01) |
| *H03F 3/21* | (2006.01) |

(52) U.S. Cl.
CPC ........... *H03F 1/0205* (2013.01); *H03F 3/193* (2013.01); *H03F 3/21* (2013.01); *H03F 2200/06* (2013.01); *H03F 2200/451* (2013.01)

(58) Field of Classification Search
CPC .................................. H03G 3/20; H03F 3/45
USPC ................................................ 330/136, 253
See application file for complete search history.

(56) References Cited

U.S. PATENT DOCUMENTS

| | | | |
|---|---|---|---|
| 5,640,681 A | 6/1997 | Barrett, Jr. et al. | |
| 6,087,894 A | 7/2000 | Barrett, Jr. et al. | |
| 6,198,352 B1 | 3/2001 | Tanji | |
| 6,392,492 B1 | 5/2002 | Yuan | |
| 6,606,001 B1 * | 8/2003 | Ziazadeh | H03F 3/345 |
| | | | 323/315 |
| 6,614,272 B1 | 9/2003 | Hayashi | |
| 7,532,066 B1 * | 5/2009 | Struble | H03F 1/3205 |
| | | | 330/288 |
| 7,737,731 B1 | 6/2010 | Luo et al. | |
| 8,854,140 B2 * | 10/2014 | Bettencourt | G05F 3/26 |
| | | | 323/315 |

(Continued)

FOREIGN PATENT DOCUMENTS

WO     WO-02052716 A1    7/2002

OTHER PUBLICATIONS

Partial International Search Report—PCT/US2016/056624—ISA/EPO—Dec. 14, 2016, 6 pages.

(Continued)

*Primary Examiner* — Henry Choe
(74) *Attorney, Agent, or Firm* — Paradice and Li LLP/Qualcomm

(57) ABSTRACT

A current-mode power amplifier is disclosed. In some embodiments, the power amplifier may include a first cascode transistor pair including a first transfer function coupled to a second cascode transistor pair including a second transfer function. The first transfer function may be an inverse of the second transfer function. The current-mode power amplifier may also include an inductive-capacitive (LC) resonant circuit to reduce the effects of gate capacitances of the first cascode transistor pair and the second cascode transistor pair. In some embodiments, the current-mode power amplifier may include a bias current controller. The bias current controller may adjust transistor bias currents based, at least in part, on an input signal received by the current-mode power amplifier.

23 Claims, 5 Drawing Sheets

Resonant Current Mirror
Output Stage

(56) References Cited

U.S. PATENT DOCUMENTS

| 9,325,282 B2* | 4/2016 | Bowers | H03F 3/195 |
| 2004/0130399 A1* | 7/2004 | Andreani | H03F 1/223 |
| | | | 330/311 |
| 2007/0241818 A1 | 10/2007 | Alenin et al. | |
| 2009/0256631 A1 | 10/2009 | Bockelman et al. | |
| 2015/0054583 A1 | 2/2015 | Miyashita et al. | |
| 2015/0286235 A1* | 10/2015 | Vahid Far | G05F 3/262 |
| | | | 323/315 |

OTHER PUBLICATIONS

International Search Report and Written Opinion—PCT/US2016/056624—ISA/EPO—Feb. 6, 2017.

* cited by examiner

CURRENT-MODE POWER AMPLIFIER

TECHNICAL FIELD

The present embodiments relate generally to communication devices, and specifically to radio frequency current-mode power amplifiers within the communication devices.

BACKGROUND OF RELATED ART

Communication devices may transmit and receive communication signals through a communication medium. In one example, the communication medium may be a wireless communication medium where communication signals are transmitted and received by communication devices according to a wireless communication protocol. Example wireless communication protocols may include IEEE 802.11 protocols and Bluetooth® protocols according to the Bluetooth Special Interest Group. In another example, the communication medium may be a wired communication medium where the communication signals are transmitted and received according to a wire-based communication protocol. Some example wire-based protocols may include an Ethernet® protocol and/or a Powerline Communications protocol described by the HomePlug 2.0 specification. In yet another example, the communication medium may be a hybrid combination of wired and wireless communication mediums.

Power amplifiers may be used to amplify wireless and/or wired communication signals for transmission through the communication medium. Output power provided by the power amplifier may vary over time. For example, a communication signal may have a relatively large peak-to-average amplitude ratio. The output power provided by the power amplifier may vary in response to the amplitude of the communication signal. As a result, accurate (e.g., linear) amplification of the communication signal is needed through the varying output power range. Inaccurate (e.g., non-linear) amplification may introduce errors in the transmitted communication signal.

Thus, there is a need to improve performance of the power amplifier over varying output power ranges and thereby increase performance of the communication device.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

In some aspects, a current mirror is disclosed. The current mirror may include a first transistor, a second transistor, and an inductor. In some embodiments, the second transistor may include a source terminal coupled to a source terminal of the first transistor, and include a gate terminal coupled to a gate terminal of the first transistor. The inductor may be coupled to the gate terminal of the second transistor, and may be configured to form an inductive-capacitive (LC) resonant circuit with a gate capacitance of the second transistor.

In other aspects, a power amplifier is disclosed. The power amplifier may include a driver amplifier configured to receive a radio frequency (RF) input signal and to generate a buffered RF input signal. The power amplifier may include a bias current controller, coupled to the driver amplifier, configured to generate a bias current based, at least in part, on the input RF signal. The power amplifier may also include a resonant current mirror output stage configured to amplify the buffered RF input signal based, at least in part, on the bias current.

In other aspects, a power amplifier may include a first cascode transistor pair including a first transfer function and a cascode transistor pair including a second transfer function. The first transfer function may be an inverse of the second transfer function. The power amplifier may also include an inductor coupled to the second cascode transistor pair and configured to form an inductive-capacitive resonant circuit with a gate capacitance of the second cascode transistor pair.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

Figure 1:
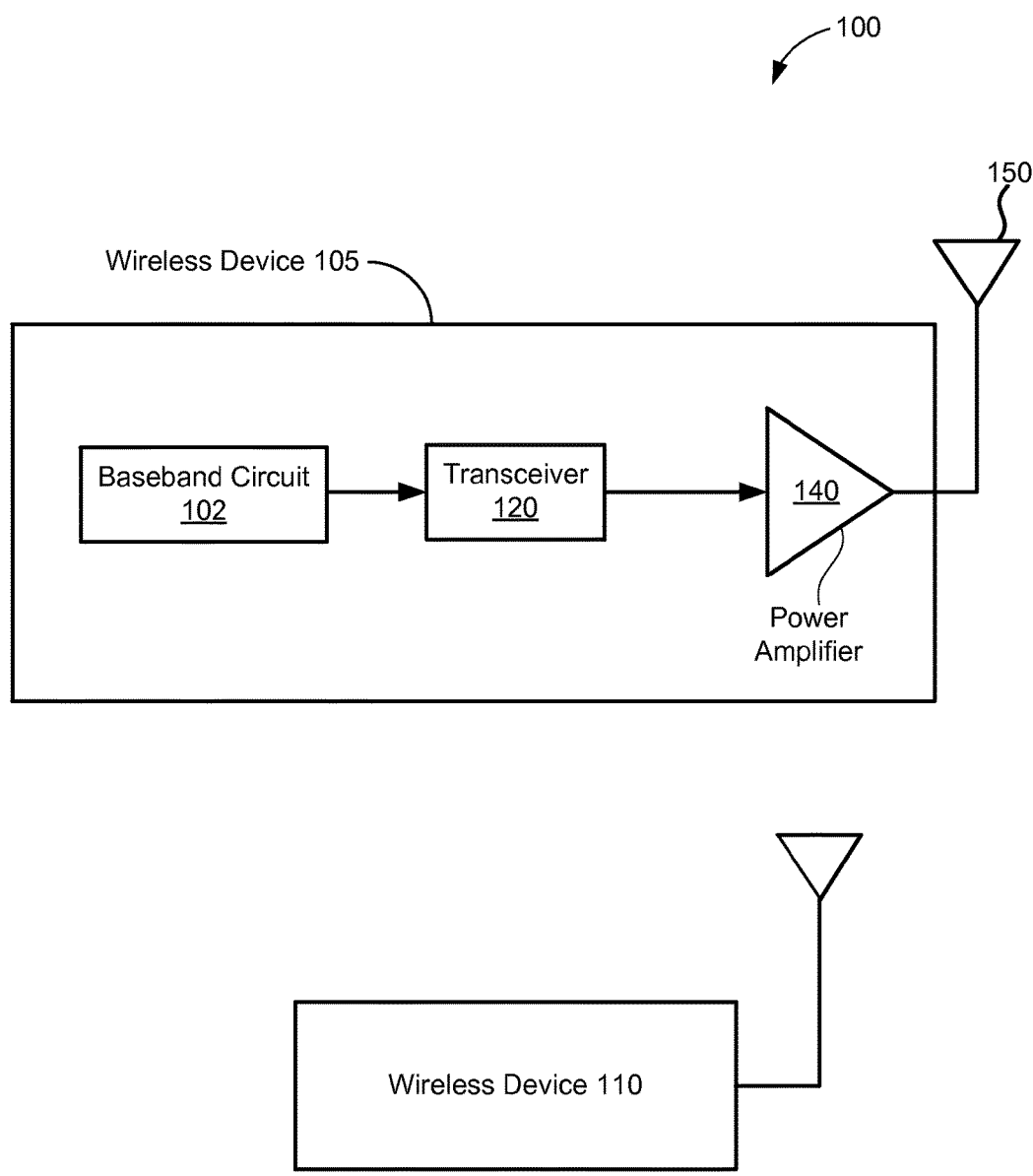
FIG. 1 depicts an example communication system within which example embodiments may be implemented.

The example embodiments are described below in the context of Wi-Fi enabled devices for simplicity only. It is to be understood that the example embodiments are equally applicable for devices using signals of other wireless standards or protocols, as well as for devices using signals of various wired standards or protocols. As used herein, the terms "wireless local area network (WLAN)" and "Wi-Fi" can include communications governed by the IEEE 802.11 standards, BLUETOOTH®, HiperLAN (a set of wireless standards, comparable to the IEEE 802.11 standards, used primarily in Europe), and other technologies used in wireless communications (e.g., ZigBee and WiGig). Thus, the terms "WLAN" and "Wi-Fi" may be used interchangeably herein.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

FIG. 1 depicts an example communication system 100 within which example embodiments may be implemented. Communication system 100 may be a wireless system and may include wireless device 105 and wireless device 110. Although only two wireless devices 105 and 110 are shown for simplicity, communication system 100 may include any number of wireless devices. In other embodiments, communication system 100 may be a wired system and may include wired devices coupled to a wire or cable (not shown for simplicity). In still other embodiments, communication system 100 may be a hybrid system and may include both wireless and wired devices.

Wireless device 105 may include a baseband circuit 102, a transceiver 120, a power amplifier 140, and an antenna 150. Although not shown for simplicity, wireless device 105 may include a plurality of antennas. Baseband circuit 102 may provide data to be transmitted to and/or receive data from one or more other devices via transceiver 120 and antenna 150. Transceiver 120 is coupled to baseband circuit 102, and may generate communication signals according to a communication protocol such as, but not limited to, Wi-Fi, BLUETOOTH, near-field communication, Zig-Bee, or any other feasible communication protocol. Communication signals generated by transceiver 120 are provided to power amplifier 140. Power amplifier 140 may amplify the communication signals based, at least in part, on a desired transmit output power and/or an amplitude of the communication signal. Amplified communication signals are provided from power amplifier 140 to antenna 150 for wireless transmission.

Wireless device 110 may include one or more baseband circuits, transceivers, power amplifiers, and antennas (not shown for simplicity) similar to those depicted in wireless device 105. Communication signals (e.g., amplified communication signals) may be transmitted between wireless devices 105 and 110.

Figure 2:
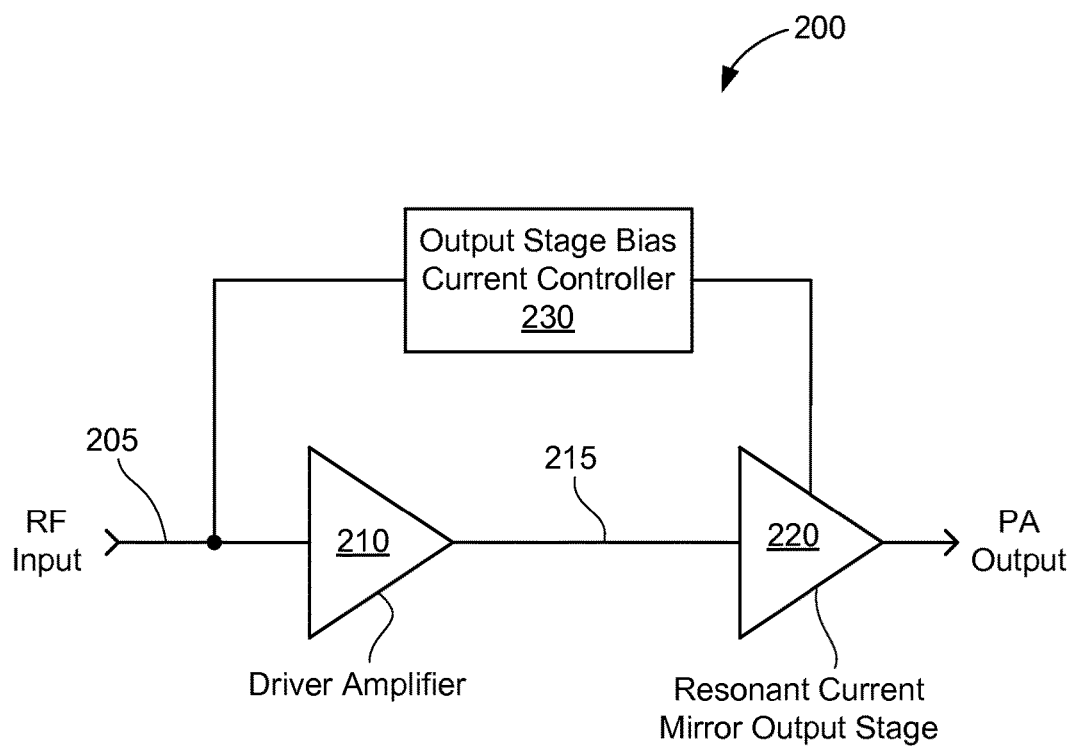
FIG. 2 shows a block diagram of a power amplifier, in accordance with example embodiments.

FIG. 2 shows a block diagram of a power amplifier 200, in accordance with example embodiments. Power amplifier 200 may be another embodiment of power amplifier 140 of FIG. 1. Power amplifier 200 may include a driver amplifier 210, a resonant current mirror output stage 220, and an output stage bias current controller 230. The driver amplifier 210 may receive an RF input signal 205 (e.g., a modulated communication signal) from transceiver 120 of FIG. 1. In some embodiments, RF input signal 205 may be a voltage-mode signal (e.g., a signal with a varying voltage and a relatively constant current). Thus, driver amplifier 210 may have a relatively high input impedance to minimize loading effects on RF input signal 205.

Driver amplifier 210, coupled to resonant current mirror output stage 220, may buffer (e.g., provide isolation for) RF input signal 205. For example, driver amplifier may receive RF input signal 205 and generate a buffered RF input signal 215 for resonant current mirror output stage 220. In addition, driver amplifier 210 may convert the voltage-mode RF input signal 205 to a current-mode signal (e.g., a signal with a varying current and a relatively constant voltage). Thus, buffered RF input signal 215 may be a current-mode signal. Resonant current mirror output stage 220 may amplify the buffered RF input signal 215. In some embodiments, resonant current mirror output stage 220 may have a relatively low input impedance to minimize loading effects on the current-mode signal from driver amplifier 210. Operation of resonant current mirror output stage 220 is described in more detail below in conjunction with FIG. 3.

Output stage bias current controller 230 may control, at least in part, bias currents for resonant current mirror output stage 220. In some embodiments, output stage bias current controller 230 may sense RF input signal 205 and may increase and/or decrease bias currents in response to RF input signal 205. Operation of output stage bias current controller 230 is described in more detail below in conjunction with FIG. 4.

Although illustrated with single lines in FIG. 2, power amplifier 200 may operate with differential and/or single-ended signals. When power amplifier 200 operates with differential signals, two complementary signals with approximately equal but opposing magnitudes may be received and amplified by power amplifier 200. In addition, signals between driver amplifier 210, output stage bias current controller 230, and resonant current mirror output stage 220 may also be differential signals. In contrast, when power amplifier 200 operates with single-ended signals, a single signal may be received and amplified by power amplifier 200. In addition, signals between driver amplifier 210, output stage bias current controller 230, and resonant current mirror output stage 220 may also be single-ended signals. A balun and/or transformer (not shown for simplicity) may be used to couple single-ended or differential signals from power amplifier 200 to antenna 150.

Figure 3:
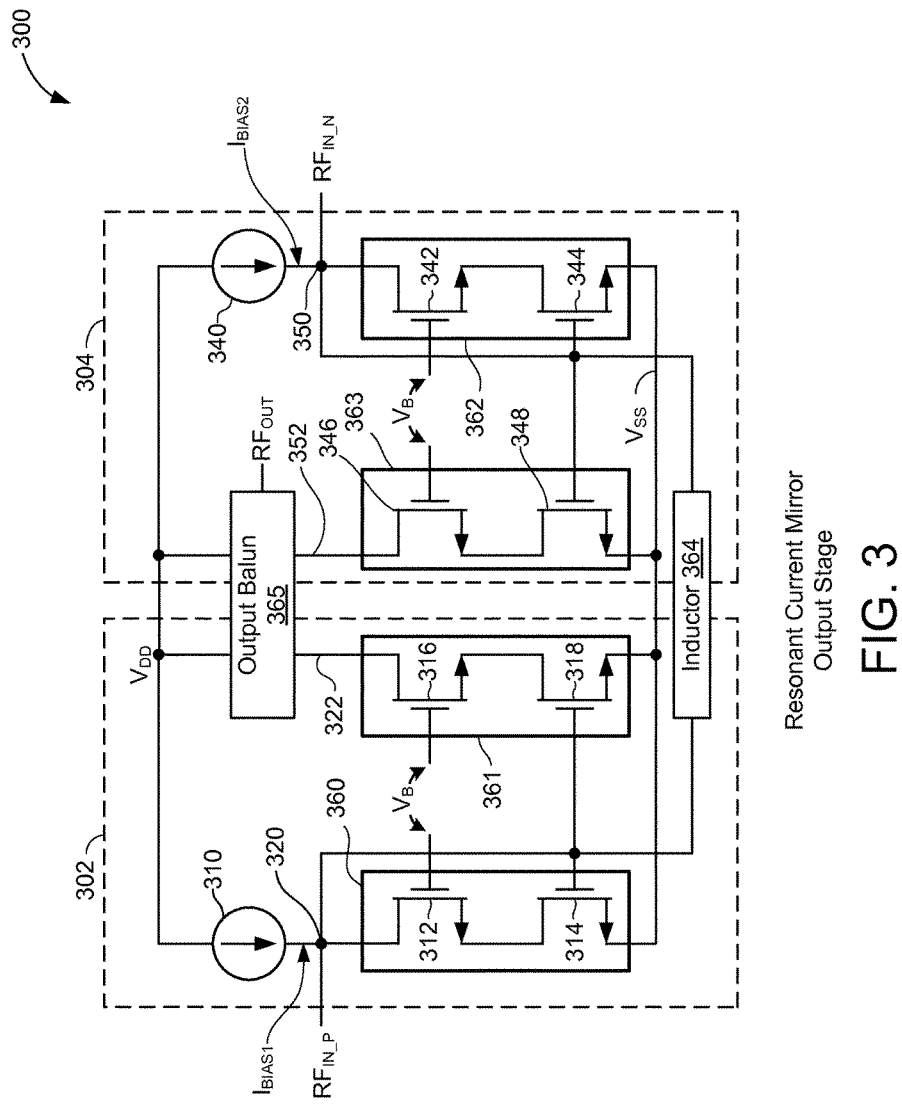
FIG. 3 is a simplified circuit diagram of a resonant current mirror output stage, in accordance with some embodiments

FIG. 3 is a simplified circuit diagram of a resonant current mirror output stage 300, in accordance with some embodiments. In some embodiments, resonant current mirror output stage 300 may be another embodiment of resonant current mirror output stage 220 of FIG. 2. Resonant current mirror output stage 300 may include a first current mirror 302, a second current mirror 304, an inductor 364, and an output balun 365. First current mirror 302 and second current mirror 304 may enable resonant current mirror output stage 300 to process (e.g., amplify) differential signals. For example, first current mirror 302 may receive and amplify a first signal of a differential signal pair and second current mirror 304 may receive and amplify a second signal of the differential signal pair.

First current mirror 302 includes a first current source 310, a first cascode transistor pair 360, and a second cascode transistor pair 361. First cascode transistor pair 360 includes a first transistor 312 and a second transistor 314. First current source 310 is coupled to first cascode transistor pair 360 at node 320. A drain terminal of first transistor 312 is coupled to node 320. A gate terminal of first transistor 312 is coupled to a bias voltage $V_B$. A source terminal of first transistor 312 is coupled to a drain terminal of second transistor 314. A source terminal of second transistor 314 is coupled to ground (e.g., $V_{SS}$). First current source 310 may provide a first bias current $I_{BIAS1}$ for first cascode transistor pair 360.

Second cascode transistor pair 361 includes a third transistor 316 and a fourth transistor 318. A gate terminal of third transistor 316 is coupled to bias voltage $V_B$. A source terminal of third transistor 316 is coupled to a drain terminal of fourth transistor 318. A gate terminal of fourth transistor 318 is coupled to a gate terminal of second transistor 314, and a source terminal of fourth transistor 318 is coupled to ground. Thus, second transistor 314 and fourth transistor 318 may allow second cascode transistor pair 361 to form a current mirror with first cascode transistor pair 360. For example, since the gate terminals and the source terminals of second transistor 314 and fourth transistor 318 are coupled together, the voltage of the drain terminals of second transistor 314 and fourth transistor 318 may be forced to be similar, creating the current mirror. Thus, current flowing within first cascode transistor pair 360 may be related to current flowing within second cascode transistor pair 361. In some embodiments, fourth transistor 318 may have a different channel width and/or length compared to second transistor 314. The different channel width and/or length may allow currents within second cascode transistor pair 361 to be scaled with respect to currents within first cascode transistor pair 360. For example, currents may be scaled to have a 10:1 relationship (e.g. 100 milliamps flowing within first cascode transistor pair 360 may be scaled to be 1000 milliamps within second cascode transistor pair 361). For other embodiments, other suitable scaling relationships may be used. First transistor 312 and third transistor 316 may be configured as common-gate amplifiers. An RF output signal of the first current mirror 302 may be provided (e.g. buffered) by a drain terminal of third transistor 316 via node 322.

Note that in first cascode transistor pair 360, an input signal $RF_{IN\_P}$ is coupled both to the drain terminal of first transistor 312 and the gate terminal of second transistor 314. In contrast, $RF_{IN\_P}$ is coupled to the gate terminal of fourth transistor 318 (and not to third transistor 316) in the second cascode transistor pair 361. The different configurations of first cascode transistor pair 360 and second cascode transistor pair 361 may allow each cascode pair to have different transfer functions. In some embodiments, the transfer function associated with first cascode transistor pair 360 may have an inverse relationship with the transfer function associated with second cascode transistor pair 361. For example, first cascode transistor pair 360 may have a first transfer function with a first non-linear gain, and second cascode transistor pair 361 may have a second transfer function with a second non-linear gain. The first transfer function may be a substantial inverse of the second transfer function. When a signal is processed by both first cascode transistor pair 360 and second cascode transistor pair 361, then an overall transfer function of first current mirror 302 may be linear. In other words, gain non-linearities associated with second cascode transistor pair 361 may be compensated for by opposing (e.g., inverse) gain non-linearities associated with first cascode transistor pair 360, thereby increasing linearity of power amplifier 200.

First transistor 312 may provide a relatively low input impedance for the $RF_{IN\_P}$ signal through the induced channel of first transistor 312. As described with respect to FIG. 2, a relatively low input impedance may minimize loading effects on current-mode signals.

First current source 310 may be a variable current source controlled, at least in part, by the RF input signal received by power amplifier 200. For example, current from first current source 310 may be based on a fixed bias current and a magnitude of the RF input signal as expressed below in equation 1:

$$I_{BIAS1}=I_{DC}+(Gm*Vin) \quad (\text{eq. 1})$$

Where: $I_{BIAS1}$ is an output current for first current source 310;

$I_{DC}$ is a DC (fixed) bias current;

$V_{in}$ is the RF input signal magnitude; and

Gm is a transconductance associated with the output stage bias current controller 230.

As shown in equation 1, as the magnitude of input signal $RF_{IN\_P}$ increases, additional current may be provided by first current source 310. The additional current may provide increased operating headroom that may, in turn, increase linearity of power amplifier 200.

A first terminal of inductor 364 may be coupled to the gate terminals of second transistor 314 and fourth transistor 318. In some embodiments, inductor 364 may form an inductive-capacitive (LC) resonant circuit with a gate capacitance of second transistor 314 and/or fourth transistor 318. If second transistor 314 is a different size with respect to fourth transistor 318, for example, to scale currents in first current mirror 302, then the larger gate capacitance may dominate and have the greatest effect on the LC resonant circuit. Inductor 364 may be selected to affect the performance of first current mirror 302 at frequencies determined, at least in part, by the LC resonant circuit (e.g., a resonant frequency). For example, inductor 364 may be selected to diminish effects of the gate capacitances of second transistor 314 and/or fourth transistor 318 at certain frequencies, such as near carrier frequencies of the RF input signal. In some embodiments, the LC resonant circuit may also affect other frequencies. For example, the LC resonant circuit may reduce undesired harmonics of the carrier frequency in the RF output signal ($RF_{OUT}$).

Second current mirror 304 may be similar to first current mirror 302. For example, second current mirror 304 may include second current source 340, third cascode transistor pair 362, and fourth cascode transistor pair 363. Third cascode transistor pair 362 may include a fifth transistor 342 and a sixth transistor 344 configured in a similar manner as first transistor 312 and second transistor 314, respectively, within first cascode transistor pair 360. Fourth cascode transistor pair 363 may include a seventh transistor 346 and an eighth transistor 348 configured in a similar manner as third transistor 316 and fourth transistor 318, respectively, within second cascode transistor pair 361. Second current source 340 may provide a second bias current $I_{BIAS2}$ for third cascode transistor pair 362, and may operate in a similar manner as first current source 310. Input signal $RF_{IN\_N}$ may be received via node 350. Second current mirror 304 may generate an RF output signal via node 352. The RF output signal may be coupled to output balun 365. A second terminal of inductor 364 may be coupled to gate terminals of sixth transistor 344 and eighth transistor 348 to form an LC resonant circuit with gate capacitances of sixth transistor 344 and eighth transistor 348.

First current mirror 302 and second current mirror 304 may operate together to process differential signals. For example, $RF_{IN\_P}$ may be a first signal of a differential RF input signal, and $RF_{IN\_N}$ may be a second signal of the differential RF input signal. Differential RF output signals may be generated by first current mirror 302 and second current mirror 304, and may be coupled to output balun 365.

Node 322 and node 352 are coupled to output balun 365. Output balun 365 may couple RF output signals (e.g., $RF_{OUT}$) from first current mirror 302 and second current mirror 304 to antenna 150 (not shown for simplicity). For example, output balun 365 may convert differential signals from node 322 and node 352 to a single-ended signal and couple the single-ended signal to antenna 150. In some embodiments, output balun 365 may also match an output impedance of first current mirror 302 and/or match an output impedance of second current mirror 304 to the impedance of antenna 150.

Although operation of resonant current mirror output stage 300 is described above with respect to differential signals, resonant current mirror output stage 300 may also operate with single-ended signals. For example, resonant current mirror output stage 300 may include first current mirror 302 and not second current mirror 304. A single-ended RF input signal may be received at node 320, and a single-ended RF output signal may be generated via node 322. Output balun 365 may couple the single-ended RF output signal to antenna 150. In other embodiments, resonant current mirror output stage 300 may include second current mirror 304 instead of first current mirror 302. When operating with a single-ended signal, inductor 364 may be coupled to a voltage similar to the gate voltage at second transistor 314 or the gate voltage at sixth transistor 344.

Although first current mirror 302 and second current mirror 304 are illustrated and described above with respect to NMOS transistors, in other embodiments, other types of transistors may be used. For example, PMOS transistors may be used in place of NMOS transistors. Those skilled in the art will appreciate that bias voltages, supply voltages, current sources, etc. may be different with respect to those described in FIG. 3 to accommodate PMOS transistor operation. Some circuits may be omitted from FIG. 3 in order to more clearly describe operation of first current mirror 302 and second current mirror 304. For example, some voltage sources, current sources, biasing circuits, etc. may be omitted for clarity.

Figure 4:
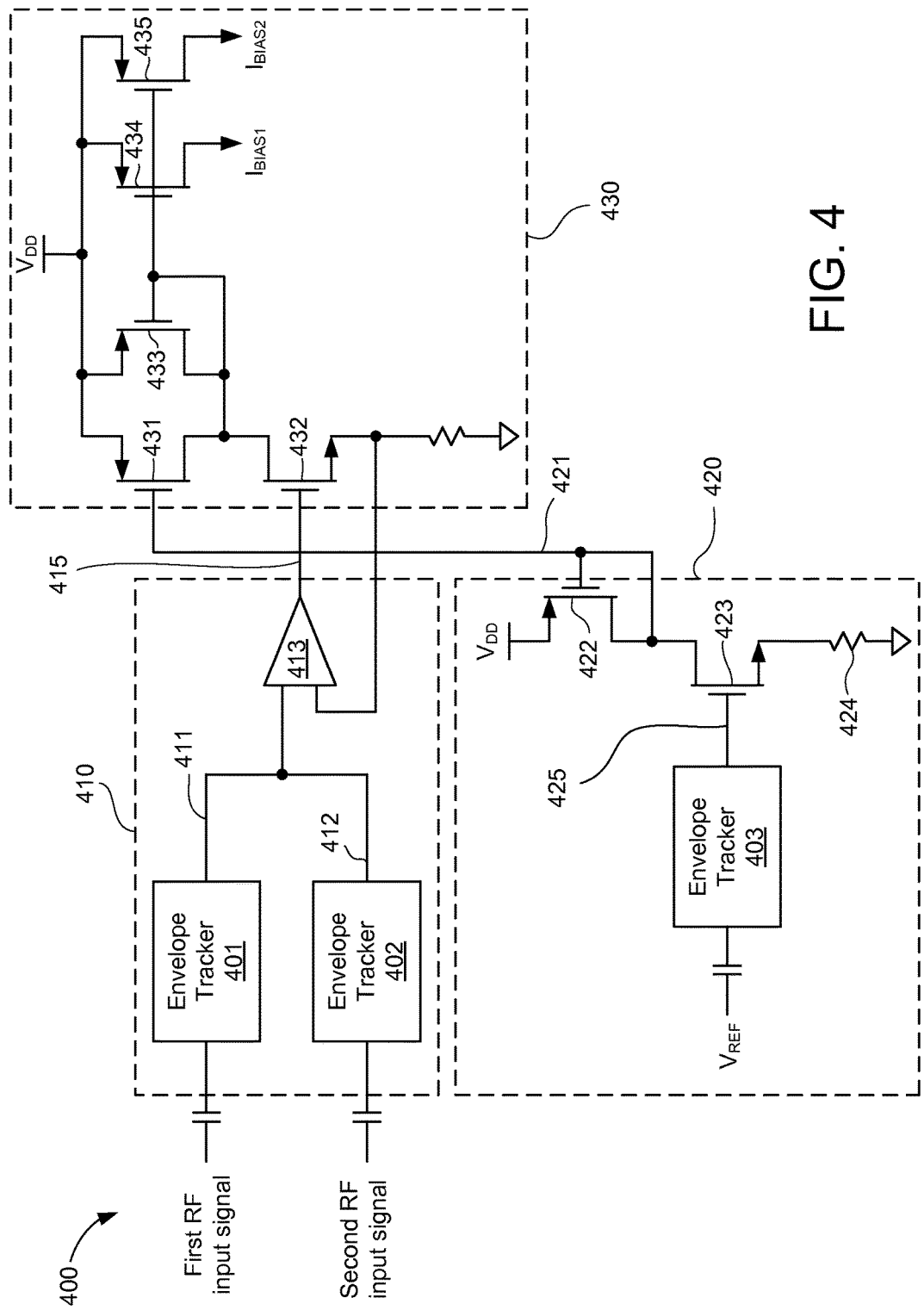
FIG. 4 is a simplified circuit diagram of an output stage bias current controller, in accordance with some embodiments.

FIG. 4 is a simplified circuit diagram of an output stage bias current controller 400, in accordance with some embodiments. Output stage bias current controller 400 may be another embodiment of output stage bias current controller 230 (see FIG. 2). As described above, output stage bias current controller 400 may provide, at least in part, a bias current for first current mirror 302 and second current mirror 304 in response to input RF signals. For example, as the input RF signal voltage increases, then more bias current may be supplied to first current mirror 302 and second current mirror 304. Output stage bias current controller 400 may include an input voltage tracking module 410, a reference voltage tracking module 420, and a bias current mirror 430.

Input voltage tracking module 410 may include a first envelope tracker 401, a second envelope tracker 402, and an amplifier 413. First envelope tracker 401 may receive a first RF input signal, and second envelope tracker 402 may receive a second RF input signal. In some embodiments, the first RF input signal and the second RF input signal may form a differential input signal received by power amplifier 200. The first envelope tracker 401 may generate a first tracking output signal 411, and the second envelope tracker 402 may generate a second tracking output signal 412. As an envelope (e.g., a voltage envelope) of the first RF input signal and/or the second RF input signal increases, then the magnitude of first tracking output signal 411 and the magnitude second tracking output signal 412 increases, respectively. First tracking output signal 411 and second tracking output signal 412 may be summed together via amplifier 413 to generate an input voltage tracking module output signal 415.

Reference voltage tracking module 420 may include a third envelope tracker 403, a first transistor 422, and a second transistor 423. The third envelope tracker 403 may be coupled to a reference voltage ($V_{REF}$). In some embodiments, the reference voltage may be ground. Third envelope tracker 403 may generate a reference tracking signal 425 in response to an envelope (e.g., voltage envelope) of the reference voltage. Thus, as the reference voltage changes due to noise, process, and/or power supply voltage variations, then the reference tracking signal 425 may also change. Reference tracking signal 425 may be buffered by first transistor 422, second transistor 423, and resistor 424 to generate reference tracking output signal 421.

The input voltage tracking module output signal 415 and reference tracking output signal 421 are coupled to bias current mirror 430. Bias current mirror 430 may include first transistor 431, second transistor 432, third transistor 433, fourth transistor 434, and fifth transistor 435. Bias current mirror 430 generates first bias current $I_{BIAS1}$ via fourth transistor 434 for first current mirror 302 (e.g., first current source 310). In a similar manner, bias current mirror 430 generates second bias current $I_{BIAS2}$ via fifth transistor 435 for second current mirror 304 (e.g., second current source 340). Bias current mirror 430 may generate bias currents (e.g., first bias current $I_{BIAS1}$ and/or second bias current $I_{BIAS2}$) based on input voltage tracking module output signal 415 and reference tracking output signal 421. For example, bias current mirror 430 may generate relatively more bias current in response to input voltage tracking module output signal 415 via second transistor 432 and relatively less bias current in response to reference tracking output signal 421 via first transistor 431. Third transistor 433 may mirror and/or scale a current determined by first transistor 431 and second transistor 432. Some circuits may have been omitted from FIG. 4 in order to more clearly describe output stage bias current controller 400.

Figure 5:
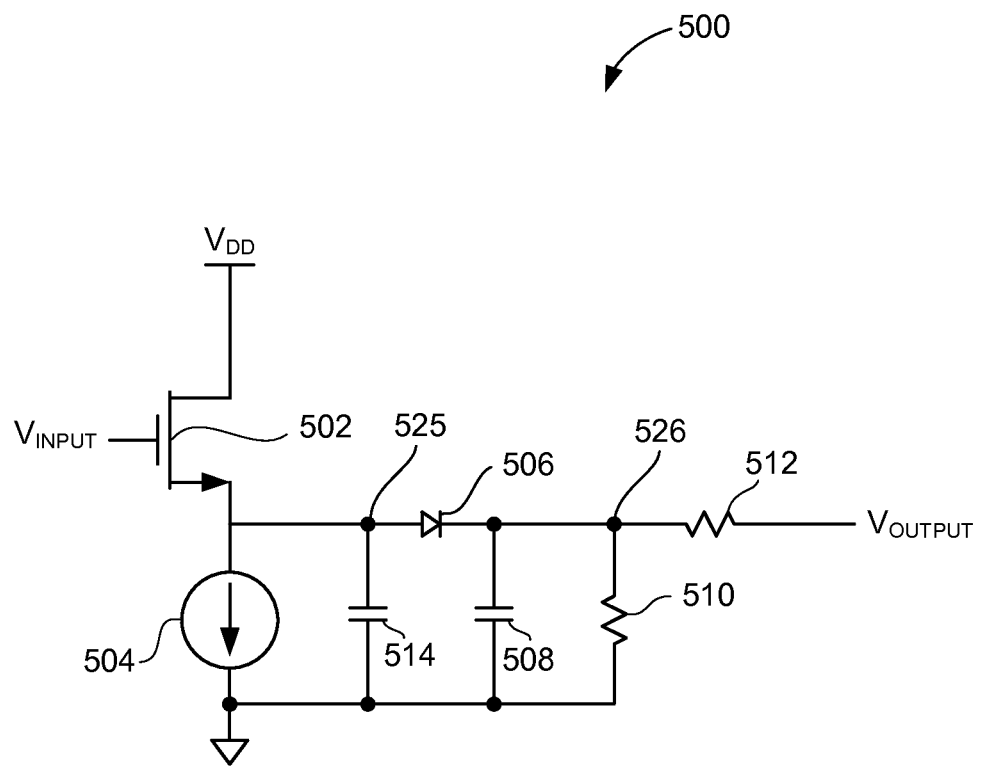
FIG. 5 is a simplified circuit diagram of an envelope tracker, in accordance with some embodiments.

FIG. 5 is a simplified circuit diagram of an envelope tracker 500, in accordance with some embodiments. Envelope tracker 500 may be another embodiment of one or more of envelope trackers 401-403 of FIG. 4. Envelope tracker 500 may receive an input signal (e.g., $V_{INPUT}$) and generate an output signal (e.g., $V_{OUTPUT}$) based, at least in part, on an envelope of the input signal. Envelope tracker 500 may include transistor 502, current source 504, diode 506, first capacitor 508, first resistor 510, second resistor 512, and second capacitor 514.

The input signal $V_{INPUT}$ may be coupled to a gate terminal of transistor 502. Transistor 502 may be biased, at least in part, by current source 504 via a source terminal of transistor 502. In some embodiments, transistor 502 and second capacitor 514 may buffer the input signal $V_{INPUT}$. The buffered input signal (now at node 525) may be rectified by diode 506 and filtered, at least in part, by first resistor 510 and first capacitor 508 to generate an envelope signal at node 526. Second resistor 512 may couple the envelope signal to an output terminal of envelope tracker 500 and generate an output signal $V_{OUTPUT}$. Some circuits may have been omitted from FIG. 5 in order to more clearly describe envelope tracker 500.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A current mirror, comprising:
a first transistor including a drain terminal configured to receive a first radio frequency (RF) input;
a second transistor including a source terminal coupled to a source terminal of the first transistor and a gate terminal coupled to a gate terminal of the first transistor; and
an inductor, including a first terminal coupled to the gate terminal of the second transistor, the inductor configured to form a first inductive-capacitive (LC) resonant circuit with a gate capacitance of the second transistor.

2. The current mirror of claim 1, wherein the second transistor is configured to generate an RF output current based, at least in part, on a first RF input current.

3. The current mirror of claim 1, wherein the LC resonant circuit is configured to increase an input impedance of the second transistor near a resonant frequency of the LC resonant circuit.

4. The current mirror of claim 1, further comprising:
a variable current source configured to generate a first bias current for the first transistor based, at least in part, on a voltage envelope of an RF input signal.

5. The current mirror of claim 1, further comprising:
a first common-gate amplifier coupled to the first transistor to form a first cascode transistor pair; and
a second common-gate amplifier coupled to the second transistor to form a second cascode transistor pair.

6. The current mirror of claim 1, further comprising:
a third transistor; and
a fourth transistor including a source terminal coupled to a source terminal of the third transistor and a gate terminal coupled to a gate terminal of the third transistor and a second terminal of the inductor.

7. The current mirror of claim 6, wherein:
a drain terminal of the first transistor is configured to receive a first RF input current; and
a drain terminal of the third transistor is configured to receive a second RF input current, wherein the first RF input current is a first signal of a differential signal pair and the second RF input current is a second signal of the differential signal pair.

8. A power amplifier, comprising:
a driver amplifier configured to receive a radio frequency (RF) input signal and to generate a buffered RF input signal;
a bias current controller, coupled to the driver amplifier, configured to generate a bias current based, at least in part, on the RF input signal; and
a resonant current mirror output stage configured to amplify the buffered RF input signal based, at least in part, on the bias current, the resonant current mirror output stage comprising:
a first transistor including a drain terminal configured to receive at least a portion of the buffered RF input signal;
a second transistor including a source terminal coupled to a source terminal of the first transistor and a gate terminal coupled to a gate terminal of the first transistor; and
an inductor, including a first terminal coupled to the gate terminal of the second transistor, the inductor configured to form an inductive-capacitive (LC) resonant circuit with a gate capacitance of the second transistor.

9. The power amplifier of claim 8, wherein at least a portion of the buffered RF input signal is coupled to the gate terminal of the second transistor.

10. The power amplifier of claim 8, further comprising:
a first common-gate amplifier coupled to the first transistor to form a first cascode transistor pair; and
a second common-gate amplifier coupled to the second transistor to form a second cascode transistor pair.

11. The power amplifier of claim 8, wherein the second transistor is configured to generate an RF output signal based, at least in part, on at least a portion of the buffered RF input signal.

12. The power amplifier of claim 11, further comprising:
an antenna; and
an output balun to couple the RF output signal to the antenna.

13. The power amplifier of claim 8, wherein the buffered RF input signal is a current-mode signal.

14. The power amplifier of claim 8, further comprising:
a third transistor; and
a fourth transistor including a source terminal coupled to a source terminal of the third transistor, and a gate terminal coupled to a gate terminal of the third transistor and a second terminal of the inductor.

15. A power amplifier comprising:
a first cascode transistor pair configured to implement a first transfer function;
a second cascode transistor pair, coupled to the first cascode transistor pair, configured to implement a second transfer function that is an inverse of the first transfer function; and
an inductor, coupled to the first cascode transistor pair and the second cascode transistor pair, configured to form an inductive-capacitive (LC) resonant circuit with a gate capacitance of the first cascode transistor pair and a gate capacitance of the second cascode transistor pair.

16. The power amplifier of claim 15, further comprising:
a variable current source configured to generate a bias current for the first cascode transistor pair based, at least in part, on a voltage envelope of an RF input signal.

17. The power amplifier of claim 15, wherein the LC resonant circuit is configured to increase an input impedance of the power amplifier near a resonant frequency of the LC resonant circuit.

18. A current mirror, comprising:
a first transistor;
a second transistor including a source terminal coupled to a source terminal of the first transistor and a gate terminal coupled to a gate terminal of the first transistor;
a third transistor;

a fourth transistor including a source terminal coupled to a source terminal of the third transistor and a gate terminal coupled to a gate terminal of the third transistor; and an inductor, including a first terminal coupled to the gate terminal of the second transistor and a second terminal coupled to the gate terminal of the fourth transistor, the inductor configured to form a first inductive-capacitive (LC) resonant circuit with a gate capacitance of the second transistor.

19. The current mirror of claim 18, wherein:

a drain terminal of the first transistor is configured to receive a first radio frequency (RF) input current; and a drain terminal of the third transistor is configured to receive a second RF input current, wherein the first RF input current is a first signal of a differential signal pair and the second RF input current is a second signal of the differential signal pair.

20. The current mirror of claim 18, wherein the second transistor is configured to generate an RF output current based, at least in part, on a first RF input current.

21. The current mirror of claim 18, wherein the LC resonant circuit is configured to increase an input impedance of the second transistor near a resonant frequency of the LC resonant circuit.

22. The current mirror of claim 18, further comprising:

a variable current source configured to generate a first bias current for the first transistor based, at least in part, on a voltage envelop of an RF input signal.

23. The current mirror of claim 18, further comprising:

a first common-gate amplifier coupled to the first transistor to form a first cascode transistor pair; and a second common-gate amplifier coupled to the second transistor to form a second cascode transistor pair.

* * * * *